United States Patent [19]
Acocella et al.

[11] Patent Number: 5,369,049
[45] Date of Patent: Nov. 29, 1994

[54] DRAM CELL HAVING RAISED SOURCE, DRAIN AND ISOLATION

[75] Inventors: Joyce E. Acocella, Hopewell Junction; Louis L. Hsu, Fishkill; Seiki Ogura, Hopewell Junction; Nivo Rovedo, LaGrangeville; Joseph F. Shepard, Hopewell Junction, all of N.Y.

[73] Assignee: International Business Machines Corporation, Armonk, N.Y.

[21] Appl. No.: 169,873

[22] Filed: Dec. 17, 1993

[51] Int. Cl.$^5$ ............... H01L 27/00; H01L 21/70
[52] U.S. Cl. ........................ 437/52; 437/47; 437/60; 437/919; 257/301
[58] Field of Search ............ 437/47, 52, 60, 919; 257/301

[56] References Cited

U.S. PATENT DOCUMENTS

| | | | |
|---|---|---|---|
| 4,688,063 | 8/1987 | Lu et al. | 257/301 |
| 4,873,205 | 10/1989 | Critchlow et al. | 437/200 |
| 4,983,544 | 1/1991 | Lu et al. | 437/919 |
| 5,214,603 | 5/1993 | Dhong et al. | 365/207 |
| 5,272,102 | 12/1993 | Hun et al. | 437/200 |

Primary Examiner—Olik Chaudhuri
Assistant Examiner—H. Jey Tsai

[57] ABSTRACT

A method of forming a MOS DRAM cell having a trench capacitor in which the strap connection to the trench capacitor, the source, drain, and isolation are all raised above the surface of the single crystal silicon includes the steps of forming the trench capacitors, depositing a blanket gate stack including the gate oxide and a set of gate layers, and then depositing isolation members in apertures etched in the gate stack using the gate oxide as an etch stop. The same sidewalls that are used to form an LDD source and drain form a self-aligned aperture for a surface strap that insulates the strap from misaligned portions of the gate stack.

8 Claims, 9 Drawing Sheets

1

DRAM CELL HAVING RAISED SOURCE, DRAIN AND ISOLATION

TECHNICAL FIELD

The field of the invention is that of CMOS integrated circuit processing.

BACKGROUND ART

In the field of integrated circuit processing, it is essential to isolate one transistor from a neighboring transistor or other component. The art currently uses a trench isolation in which a trench is etched into the electrically active silicon and filled with oxide, or LOCOS isolation in which thermal oxide is grown downwardly into the silicon. Variations on these schemes are well known in the art, all commonly having the factor that there is an insulator, usually $SiO_2$, of a thickness sufficient to prevent voltage on an interconnection line above the insulator from inverting the silicon beneath the insulator and thereby creating a parasitic channel; and that all or part of the isolation is recessed to provide for smaller step height for the interconnection. Throughout the years, the art has tended to smooth topographical features in the isolation while maintaining protection against parasitic channel formation.

Before the introduction of LOCOS, when design rules were above 5 μm, a blanket oxide was grown over the wafer before any of the elements of the transistors were fabricated. Apertures were etched into the blanket insulation to hold the transistors. In this case, topographical features were severe, which caused significant reduction in yield as design ground rules became smaller and the step to be traversed by interconnects became sharper. One distinguishing feature of this old prior art work compared with more recent prior art work was that there was a direct line between adjacent transistors along the surface of the single crystal silicon.

A number of problems have also become apparent in the case of trench isolations, which are preferred to the old blanket approach because of their planar surfaces and because of the elimination of the "bird's beak" associated with LOCOS isolations, thereby permitting a shorter, smaller transverse dimension than LOCOS isolations. The approaches in the art have recessed the insulator into the single crystal area, with the result there was an increased risk of creating defects in the single crystal material in the process of forming the isolation. The art has long sought a method of isolation in which the smallest transverse distance can be obtained without compromising the effectiveness of the isolation.

SUMMARY OF THE INVENTION

A method of forming a MOS DRAM with a less than 0.35 μm ground rule cell having a trench capacitor in which the strap connection to the trench capacitor, the source, drain, and isolation are all raised above the surface of the single crystal silicon includes the steps of forming the trench capacitors, depositing a blanket gate stack including the gate oxide and a set of gate layers, and then depositing isolation members in apertures etched in the gate stack using the gate oxide as an etch stop. A self-aligned gate contact is formed when the gate stack is patterned. The same sidewalls that are used to form an LDD source and drain form a self-aligned aperture for a surface strap that insulates the strap from misaligned portions of the gate stack.

BEST MODE OF CARRYING OUT THE INVENTION

Figure 1:
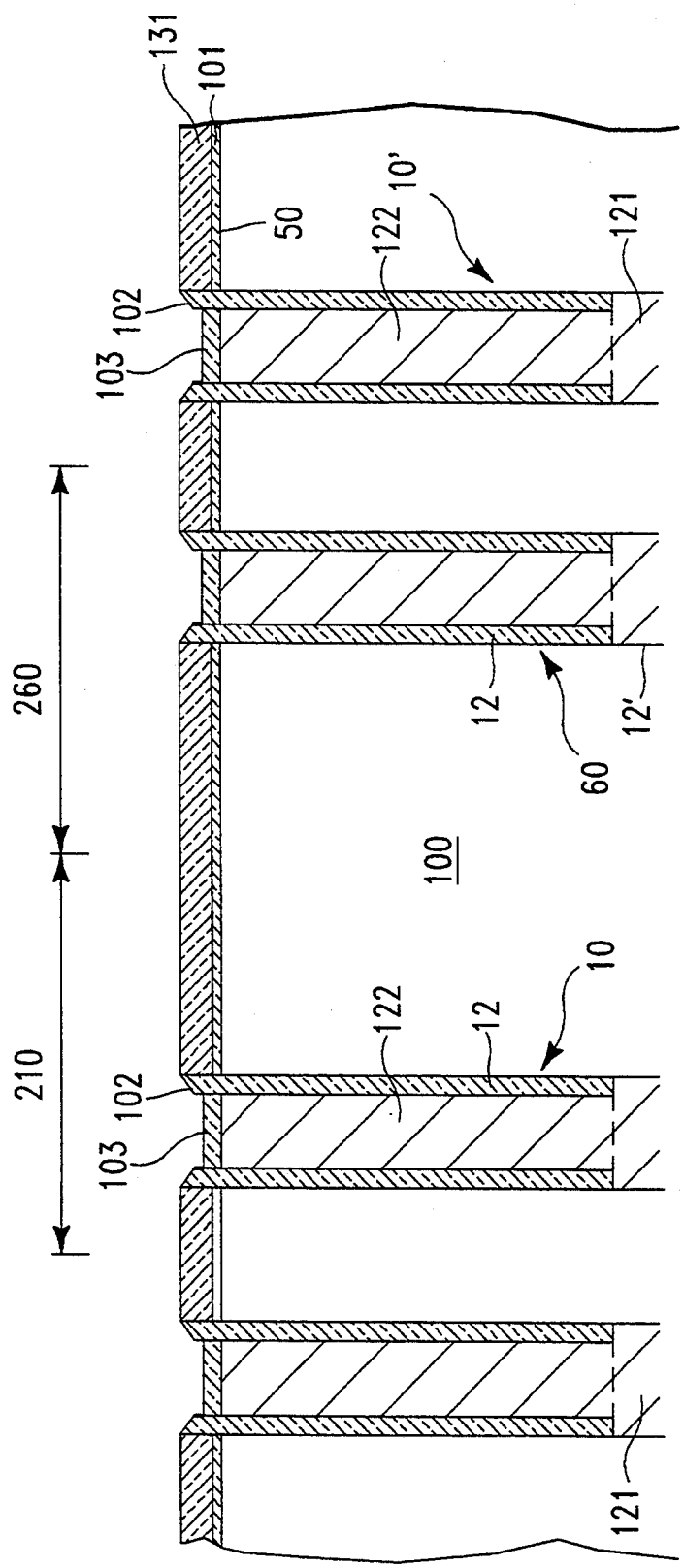
FIGS. 1 through 8 show in cross-section a portion of two adjacent DRAM cells sharing a common word line.

Referring now to FIG. 1, there is shown in cross-section a portion of a silicon integrated circuit formed in single crystal substrate 100 having a surface 50. The two portions denoted by arrows labeled 210 and 260, respectively, show areas that will become the locations of adjacent DRAM memory cells. On the left of the figure, below the arrow labelled 210, there is a trench capacitor 10 etched through a nitride ($Si_3N_4$) and a thin oxide ($SiO_2$) layer down into the substrate a substantial distance, extending below the boundary of the figure. These trench capacitors are formed through a first layer consisting of a thin thermal oxide 101 and a nitride 131. The epitaxial layer 100 of the single crystal silicon has been previously prepared by forming N-wells and/or P-wells and with the use of blanket threshold implants as is conventional in the art. These preliminary steps will be referred to as preparing the epitaxial layer. Trench capacitor 10 is constructed in a conventional fashion as illustrated in U.S. Pat. No. 5,065,273 or other equivalent methods. It uses two layers of polysilicon (poly) as the central capacitor electrode. The lower poly layer 121 has been polished and recessed by an etch so that a thicker oxide insulating collar 12 can be formed at the top portion of the trench. A second layer of polysilicon 122 is formed above layer 121, polished back, and oxidized using the nitride/oxide layers as a mask to form a self-aligned oxide insulating cap 103. Insulation for the capacitor is provided by a thin oxide layer or oxide-nitride layer 12' formed before the trench was filled with poly 121. On the right side of the figure below the arrow labeled 260, there is a trench capacitor 60 having the same features. Other trench capacitors are shown which are part of cells that extend out past the boundaries of the figure. The top surface of polysilicon 122 will be referred to as the trench top surface and the insulator 103 as the trench top insulator. Following the formation of insulator 103, the nitride/oxide layers 131 and 101 are removed by wet etching or by an isotropic dry etch. Since the oxide 102 and 103 is much thicker than oxide 101, it is not necessary to mask them off. Oxides 102 and 103 are 1,000–2,000 Å thick. Oxide 101 is only about 100 Å, so that a dip etch will not significantly affect oxides 102 and 103.

Figure 2:
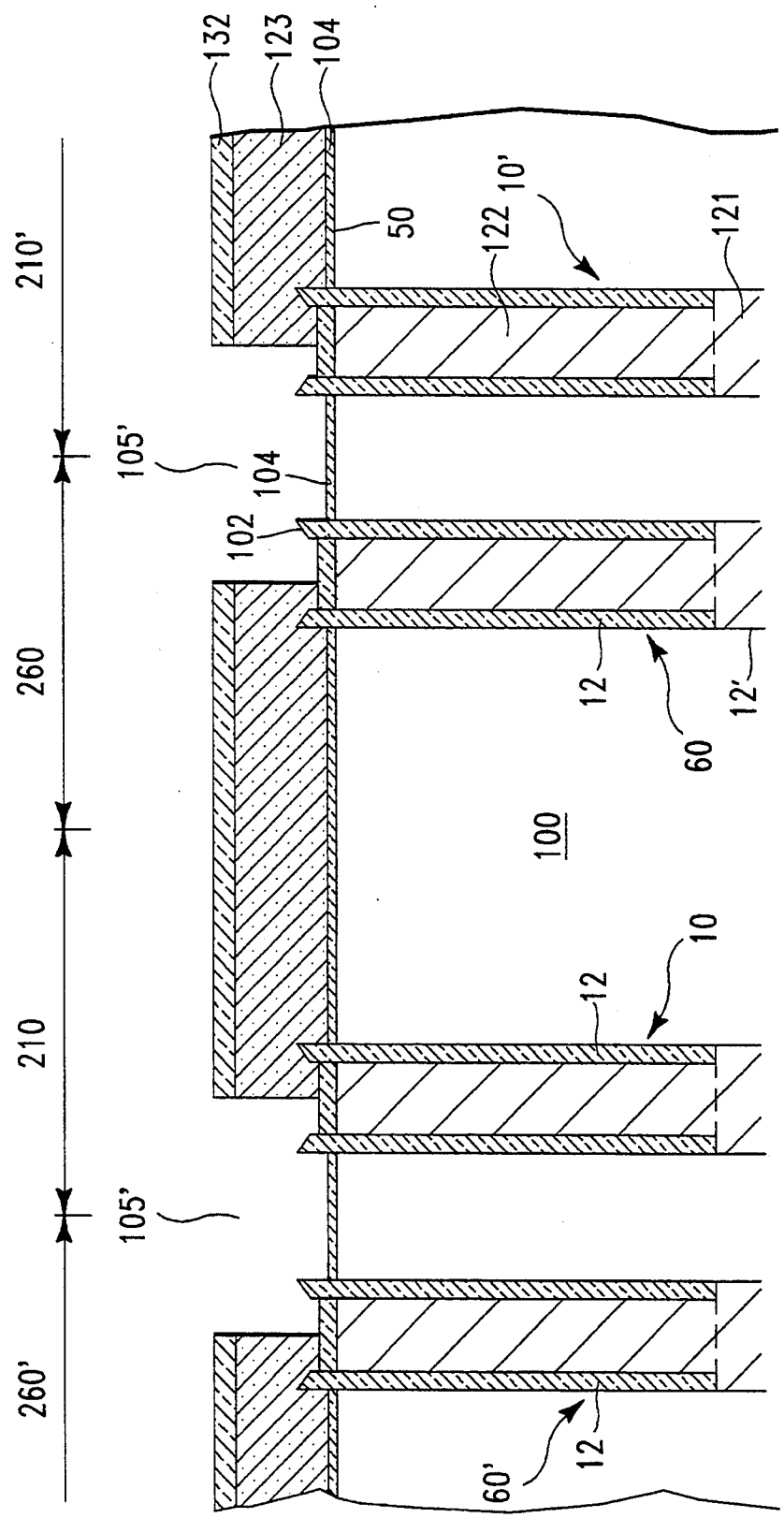

Referring now to FIG. 2, there is shown the same area with a set of three layers denoted on the right by the numerals 104, 123 and 132, in which 104 is the gate oxide ($\leq 100$ Å $SiO_2$, formed by conventional dry thermal oxidation) of the final transistor gates that will be used, layer 123 is a third layer of about 2000 Å of polycrystalline silicon (poly) doped N+, and layer 132 is a layer of nitride ($Si_3N_4$) that protects layer 123. One skilled in the art will understand that there is often a very thin layer ($\leq 100$ Å) of $SiO_2$ inserted between layers 123 and 132. A pair of apertures denoted 105' have been cut down through the set of three layers which is called the gate stack set of layers. The isolation members will be formed in these apertures. A conventional etching process such as reactive ion etching (RIE) has been used to cut down through nitride 132 and poly 123, stopping on oxides 103, 102, and 104. Poly layer 123 and subsequent poly layers are doped by ion implantation after being put down. These implants are not heated in a diffusion step until after a self-aligned poly gate contact has been made and both the bit line and the word line are in place.

The portion of the gate stack that remains covers the entire active device area of two DRAM cells, each of which will contain a gate electrode, a shared bit line diffusion, and a diffused surface strap connection to the deep trench capacitor. At this time a self-aligned field implant may be performed if it is desired to have the advantage of better isolation. A typical field implant for a P− doped substrate might be about $5 \times 10^{17}/cm^3$ (boron).

Figure 3:
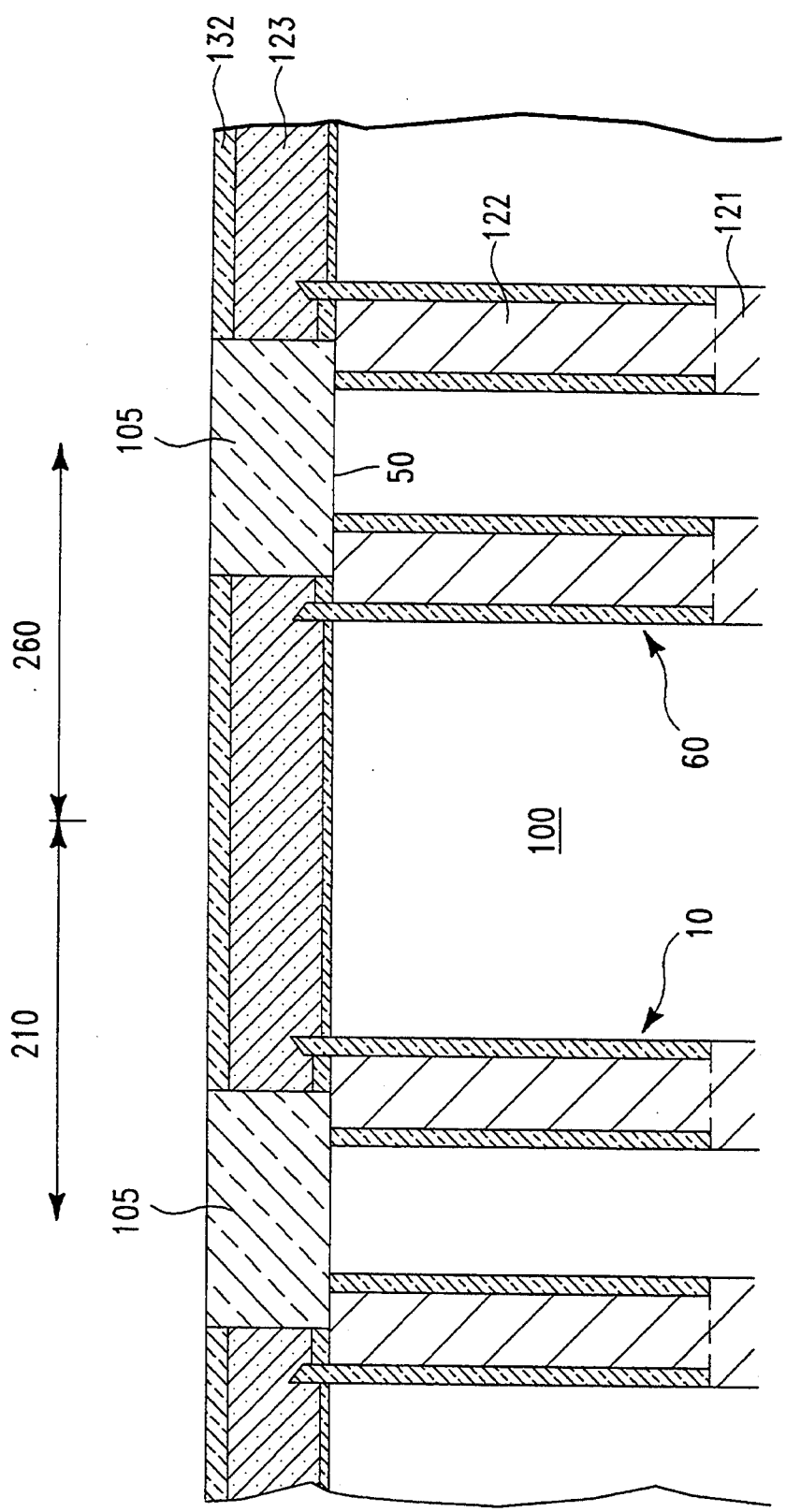

Referring now to FIG. 3, there is shown an oxide 105 which has been deposited in apertures 105' in a conventional low pressure CVD oxide process, e.g. TEOS, and which has been chemical-mechanically polished in a conventional fashion as illustrated in U.S. Pat. No. 5,015,594, so that there is a planar surface, referred to as the isolation surface, in which the oxide 105 is coplanar with the top of nitride 132. Nitride layer 132 is stripped and replaced by a fourth poly layer labeled 124 which is then polished down, again using oxide layer 105 as a polish stop so that the isolation surface remains as before. On this planar surface a fifth layer of poly 125, blanket doped N+, followed by another layer of nitride 133 is put down. Poly 124 is optional, since it merely improves the planarity of the top surface. If poly 124 were not used to fill the depression left by removal of nitride 132, the process could still be carried out by depositing poly 125. The structure would simply not be as planar and may or may not cause subsequent topography problems, depending on the tolerance of later steps.

Figure 4:
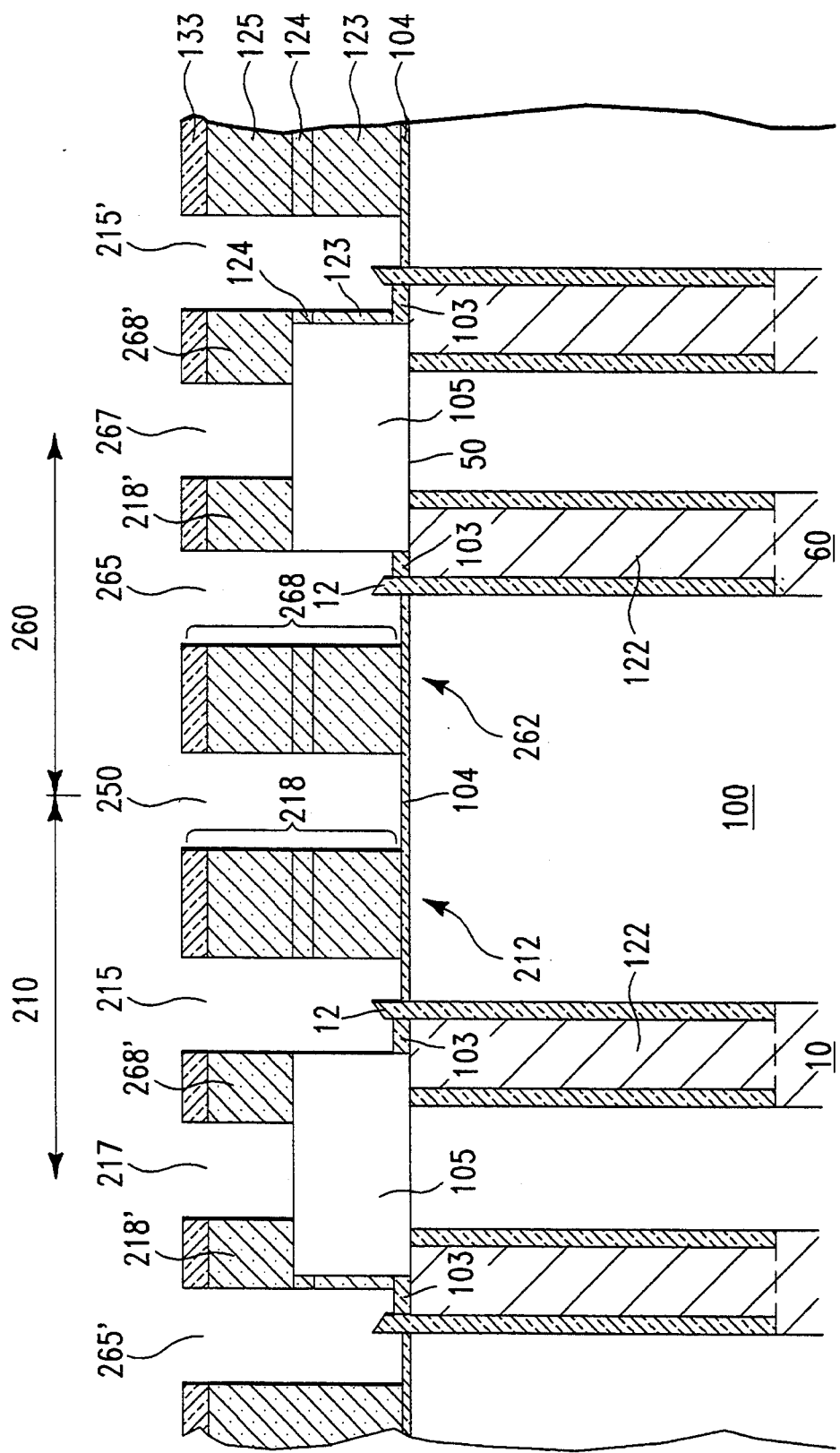

Referring now to FIG. 4, the gate stack now consists of oxide 104, the poly 123, the two extra levels of poly 124 and 125, and the top nitride 133. A gate conductor pattern (word line) is then cut in a RIE process, stopping on gate oxide 104, capacitor cap 103 and oxide collar 12. This etch defines both the gates and the poly in layer 125 between the gates. Within the cell, the etch defines a center aperture 250 that will be the common contact point for both DRAM cells 210 and 260, since they share a common source, and also defines a pair of apertures 215 and 265 in the respective cells that will be the apertures that contain the surface straps. The two stacks in the cells are now labeled collectively as 218 and 268. Above oxide 105 there is a set of other conductors 218' and 268' which extend perpendicular to the plane of the paper to make contact with cells that are behind the cell illustrated here. The layout is a conventional one in which the cell is wider than the narrower word line and in which adjacent rows of cells overlap in the transverse dimension. The cross-section in FIG. 4 illustrates the wide portion of cells 210 and 260, and the narrow area above isolation 105 that connects to cells on the left and right. The wide portion of the adjacent cells is behind the plane of this cross-section and overlaps the area indicated by arrows 210 and 260.

Those skilled in the art will appreciate that there must be a conductive contact (conventionally referred to as a strap) between poly 122 and the transistor source in the single crystal material. If the strap makes contact with the gate or if the gate makes contact with the source, the cell will not work. It is an advantageous feature of the present invention that the strap is self-aligned and protected from the gate (as will be shown below). Considerable tolerance is therefore permitted in the placement of apertures 215 and 265. In the embodiment illustrated, the nominal gate width is $\leq 0.35$ μm, the nominal width of the source is $\leq 0.25$ μm, the nominal width of aperture 215 is $\leq 0.25$ μm. So long as 0.2 μm of the source is exposed for contact with the strap, the cell operation will be satisfactory, so that the placement tolerance on aperture 215 is $\pm 0.1$ μm.

Some possible misalignments are illustrated in the Figure. Cell 210 is shown as being correctly aligned in this drawing, with aperture 215 extending to the edge of oxide 105. The partially completed cell on the left is shown as having a substantial misalignment in that aperture 265' is displaced to the left so that a portion of conductive gate stack 218' extends downward to the area that will be the strap. Those skilled in the art will appreciate that if this fault were not corrected there would be a short circuit between the strap that will be put down in aperture 265' and the conductive member 218'. Similarly, there is misalignment shown on the right hand of the figure with the similar conductive strap 268' extending downwardly. In cell 260 the conducting member 218' does not extend down, but the horizontal distance of oxide 103 that is exposed is less than the standard amount in cell 210, so that there will be less contact area to the poly layer 122. These misalignments are illustrated in the same figure for convenience, although in actual practice, a misalignment will be substantially uniform across the chip.

Figure 5:
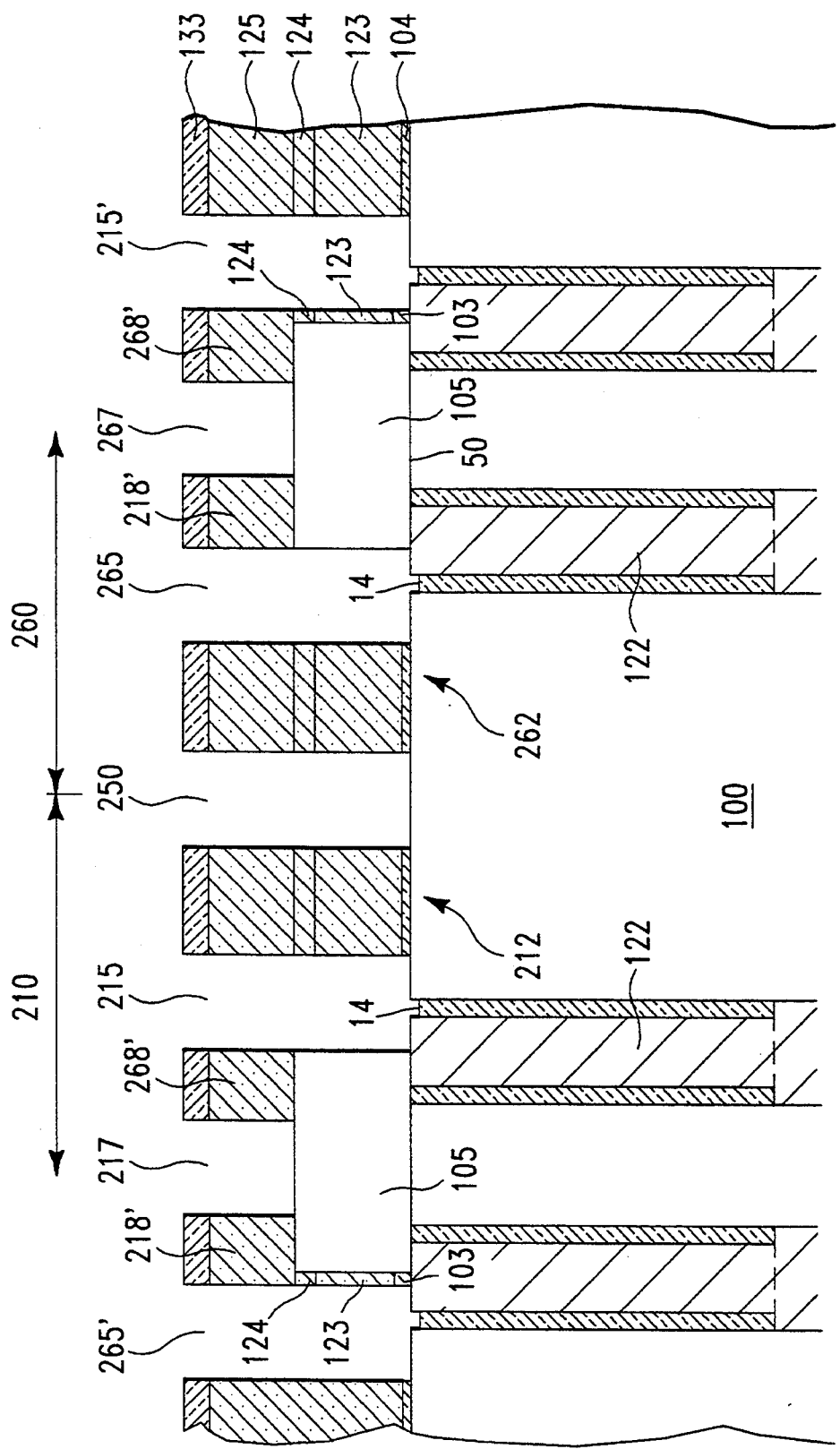

Referring now to FIG. 5, there is shown the next step in which the oxide at the bottom of the apertures has been stripped by a selective oxide etch, e.g. BHF, with some over-etch, so that the oxide liner 12 in the trenches has been removed in sub-apertures 14 by some small amount. This is not only a feature for insuring that the oxide is removed, it also has the beneficial effect of providing greater contact area for the strap between the source of the transistor and the center electrode of the capacitor since the vertical edge of sub-aperture 14 is available for making electrical contact with poly 122. At this time, a light implant, the first dose of an LDD (Lightly Doped Drain) may be performed. A typical implant is $\sim 5 \times 10^{14}/cm^2$. of arsenic or phosphorous for an N-channel device.

Figure 6:
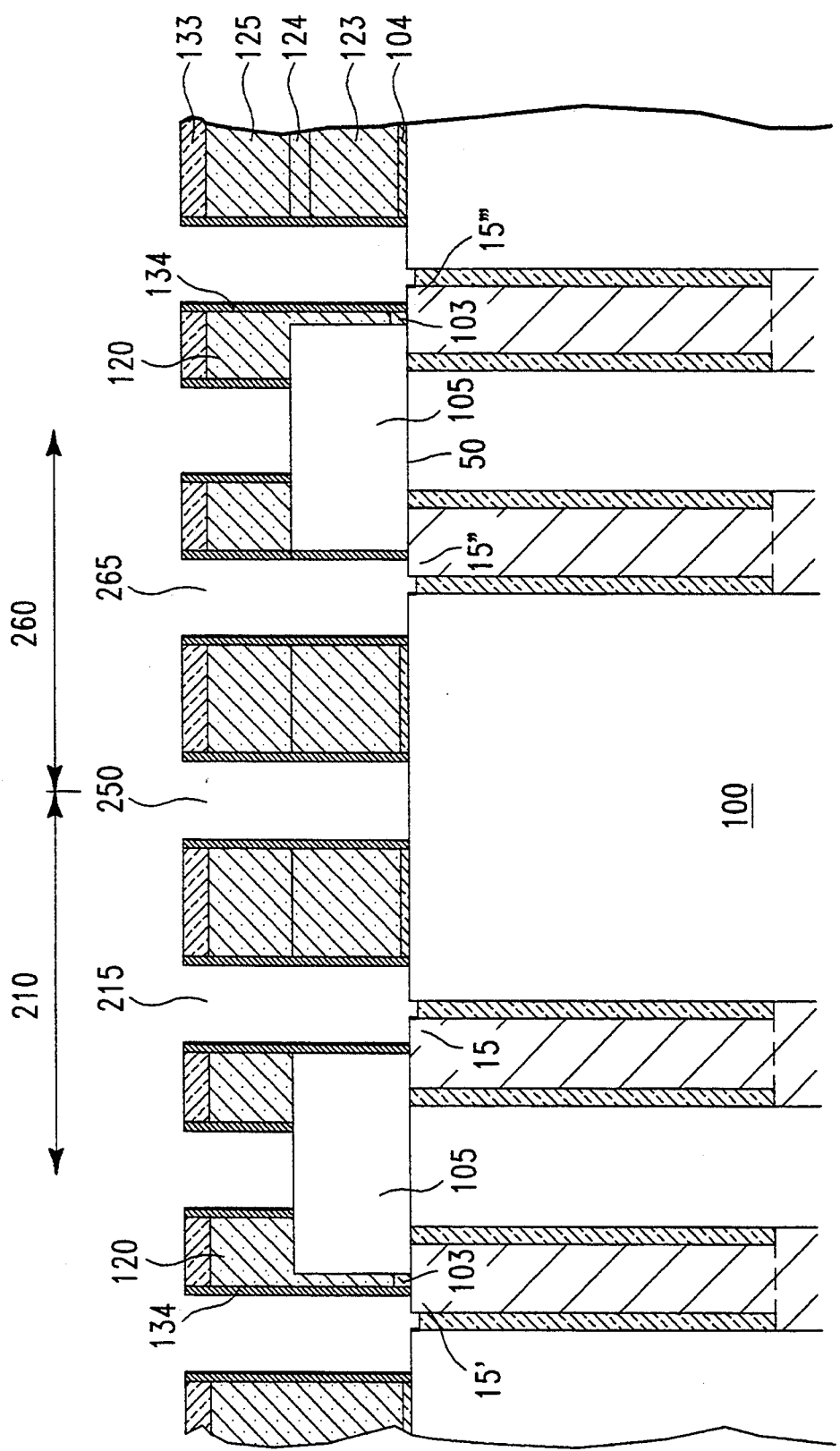

Referring now to FIG. 6, a set of conformal sidewalls denoted collectively with the numerals 134 has been formed on the sides of all the apertures. These sidewalls are illustratively, a first layer ($\approx 100$ Å) of thermal oxide followed by a layer ($\approx 400$ Å) of nitride. The corners 15, 15', 15", 15''' are flagged to indicate 15 is correctly aligned, 15' and -" are smaller than normal, and 15''' is essentially not present so that sufficient contact will not be formed. Layer 134 isolates the gate stack from the strap connection that will be formed and also serves as the implant mask for the second source/drain implant.

Figure 7:
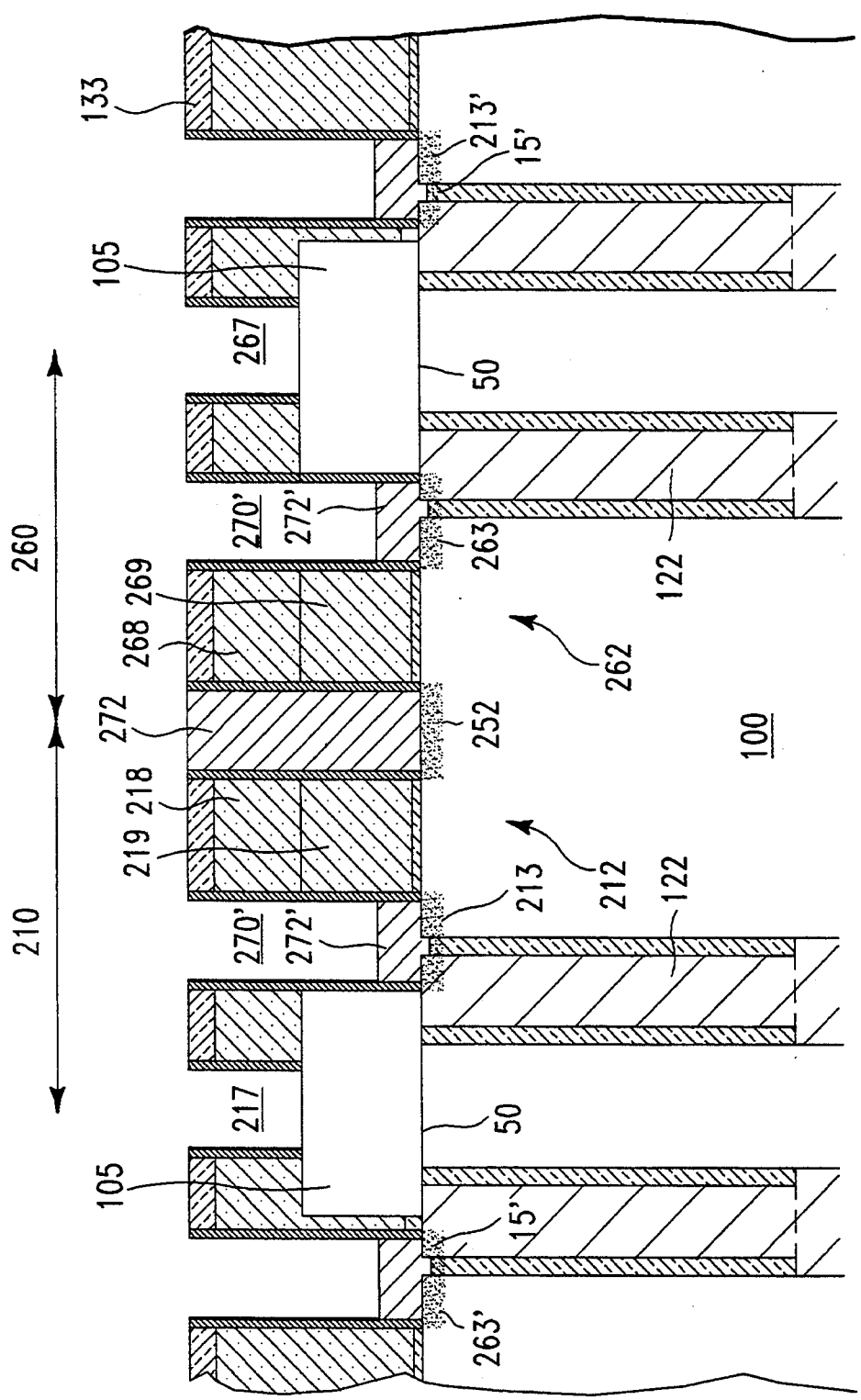

Referring now to FIG. 7, there is shown the results of a heavier source/drain implant in which the sidewalls protect the LDD portion of the transistor from the heavier dose so that the more heavily doped areas forming the sources and drains have been formed without affecting the previous light dose. A sixth layer of polysilicon (doped either as it is put down or by implantation) 126 has been deposited in the apertures and polished back using nitride layer 133 as a polish stop. Poly 126 in the former aperture 270 is a cell input/output contact from common source 252 that will be connected to a bit line in a later step as a connector 272. After the polishing operation, the apertures 270' have been etched down to reduce the thickness of the polysilicon 126 in those apertures so that there will be less capacitance on the straps 272' connecting drains 213 and 263 to the trench capacitor electrodes 122, and also to prevent shorting of a cell to its neighbor by poly 126. Since the thickness of the strap is not critical, a timed etch is suitable. Apertures 217 and 267 have been stripped in the same etch step that reduces the thickness of the straps. An annealing step may be performed at any convenient time to activate the implant doses. Transistors 212 and 262 are now electrically complete at this stage.

Figure 8:
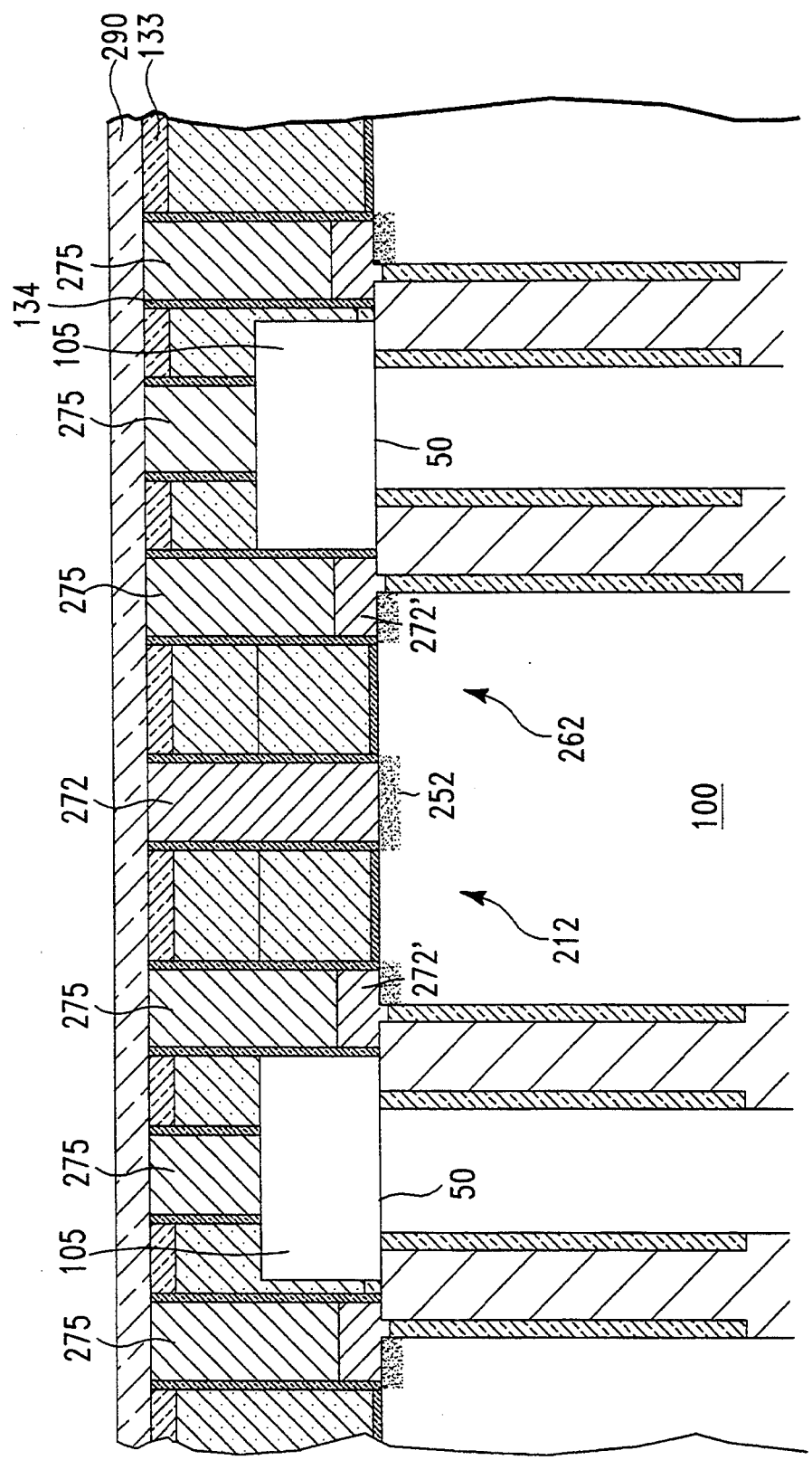

A final cross-section in FIG. 8 indicates that a layer of insulator such as phosphorus silicon glass (PSG) 275 has been deposited in the empty apertures and polished down to the top level of nitride 133. A top layer of polysilicon or metal 290 has been deposited—running from left to right in the drawing; this will be the bit line connecting a number of cells in common. Area 252 is a common contact in the substrate and the signal extends upwardly through connector 272 and horizontally along word line 290 to a sense amplifier. The word lines, which are connected to the gates of the transistors, extend perpendicular to the plane of the paper. Portions of nitride 133 behind or in front of the plane of the cross section will be removed at any convenient time to make contact with the word lines. Additional layers will be formed on top of layer 290 to establish the interconnections, as is conventional.

An advantageous feature of the invention is that the isolation is formed above the surface of the silicon, surface 50 in FIG. 3. Referring for convenience to FIG. 8, it can be seen that there is a straight path along a surface 50 between the single crystal substrate and the bottom of oxide 105 between the trench on one capacitor and the corresponding trench on the other capacitor. In the prior art, a straight line on the surface was not tolerated and a shallow trench was typically cut down to about the same depth as the thickness of the source and drain to insure that the insulator was thick enough to prevent parasitic channeling and in the case of a finite conductivity of the substrate that any conductive path had to travel an irregular line of greater length. In LOCOS isolation, the thermal isolation oxide also grows down into the single-crystal substrate. In operation, one capacitor may be charged up to the nominal voltage of the device (5 volts or so) while the other is at ground providing a potential path through the short distance between them. In the case of the example illustrated, the groundrule is a nominal 0.25 micron, so that the potential for leakage is evident.

Figure 9:
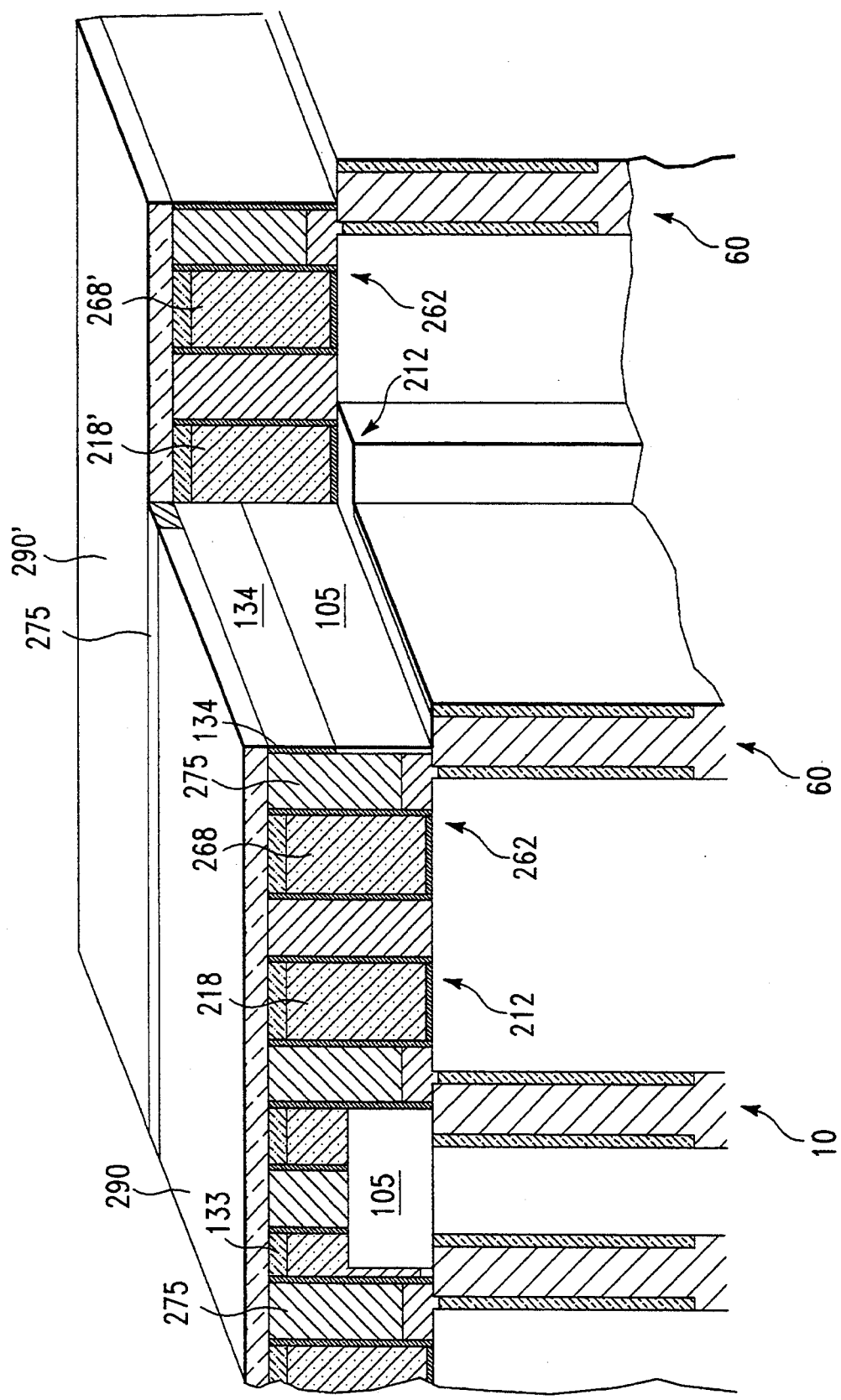
FIG. 9 illustrates an isometric view of the same area.

Referring now to FIG. 9, the same area is shown in perspective with a portion of a cell in the next row behind. The same transistors 212 and 262 are present with transistors 212' and 262' being in the next row. The view has been cut along the edge of sidewall 134 above trench capacitor 60, showing on the wall the areas 105 and 218' where the isolation oxide and the word line of transistor 212' are passing. Glass 275 isolates bit line 290 from the next bit line 290'. Gate stack 218' extends left in the drawing behind glass 275 of cell 262 because the back row contains the wider portion of cell 212'. Trench 60 extends back the same distance as gate 268, separated from the next row by a tolerance distance.

Those skilled in the art will appreciate that the self-aligned gate contact of poly is a significant advantage over prior art self-aligned gate contacts in which a nitride cap over the gate was surrounded by an oxide layer. When the nitride cap was removed, an aperture was created that could be filled by a metal contact. Since the metal cannot stand high temperatures, prior art self-aligned gate contacts had the disadvantage that the thermal budget after their formation was severely restricted.

Additionally, the use of poly layers in the gate stack that are implanted after deposition and the deferring of heat treatment to diffuse the implants and activate the source and drain until after the bit line is in place avoids a problem in the prior art in which heat treatment of poly doped as it was put down increased the grain size which, in turn, permitted subsequent oxide etchants to penetrate along grain boundaries and damage underlying layers. In this process, the poly is not exposed to an oxide etch after the heat treatment, so the possibility of penetration does not arise.

We claim:

1. A method of forming a set of memory cells for a MOS DRAM in a set of cell areas of a silicon substrate, each memory cell having an access transistor formed on an epi top surface of a single crystal epitaxial silicon layer, controlled by a first control line, and connected between an input/output line and a trench storage capacitor, comprising the steps of:

preparing said epitaxial layer;

forming a set of said trench storage capacitors in said epitaxial layer having a conductive center electrode insulated from said epitaxial layer, said center electrode having a conductive trench top surface covered by a trench top insulator;

forming a gate stack set of layers comprising a gate oxide layer on said epi top surface, at least one gate poly layer above said gate oxide layer and a gate nitride layer above said gate poly layer;

forming a set of isolation apertures isolating said cell areas by etching said gate nitride and said gate poly layers down to said gate oxide layer in a set of isolation areas covering an isolation portion of said trench top insulator and extending between adjacent cell areas, whereby said trench top insulator has a strap portion outside said isolation aperture and within said cell area;

depositing isolation oxide in said isolation apertures and polishing said isolation oxide using said gate nitride as a polish stop down to an isolation surface defined by said gate nitride;

forming a gate conductive layer of poly over said cell areas and isolation areas;

forming a gate protective layer of nitride over said gate conductive layer of poly;

patterning and etching down to said gate oxide layer a set of source-drain apertures covering source and drain portions of said cell, said set of source-drain apertures including a strap aperture subset of said set of source-drain apertures, exposing said strap portions of said trench top insulators said strap aperture subset being aligned with said isolation regions and individual pairs of said set of source-drain apertures being separated by a transistor gate portion of said gate stack and said gate conductive layer of poly;

removing said trench top insulator and said gate oxide within said strap aperture subset of said set of source-drain apertures;

implanting an LDD dose of ions within said set of source-drain apertures;

forming LDD sidewalls within said set of source-drain apertures by depositing at least one conformal insulating layer on side walls of said source-drain apertures and removing said conformal layer from the bottom of said apertures, thereby forming a set of self-aligned strap apertures in which the strap location is insulated from misaligned portions of the gate stack by the sidewalls;

implanting sources and drains within said set of source-drain apertures, thereby defining a self-aligned access transistor comprising a source, a drain and a transistor gate lying between said source and drain;

depositing a conductive material within said set of source-drain apertures, thereby forming a surface strap connection between said trench capacitor and said access transistor and a cell input/output contact and polishing said conductive material to be coplanar with said isolation surface.

2. A method according to claim 1, in which a gate contact aperture is formed by removing a portion of said gate protective layer of nitride after formation of said LDD sidewalls and after formation and polishing of said cell input/output contact, whereby said gate contact aperture is separated from said cell input/output contact by said LDD sidewall.

3. A method according to claim 2, in which said step of forming said gate conductive layer is preceded by the steps of:

removing said gate nitride outside said isolation areas, whereby a cell in said set of cell areas has a depression below said isolation surface;

filling said depression with a second gate poly layer; and polishing said second poly gate layer using said isolation oxide as a polish stop, whereby said set of cells has a top surface at said isolation surface.

4. A method according to claim 3, further including the step of removing an upper portion of said conductive material within said strap aperture subset of said set of source-drain apertures to form a strap having a strap top surface below said isolation surface; and depositing an insulator above said strap and polishing said insulator to said isolation surface using said isolation oxide as a polish stop.

5. A method according to claim 4, further including the step of performing a field implant in said isolation areas and then growing a thin thermal oxide in said isolation areas before deposition of said isolation oxide.

6. A method according to claim 1, in which said step of forming said gate conductive layer is preceded by the steps of:

removing said gate nitride outside said isolation areas, whereby a cell in said set of cell areas has a depression below said isolation surface;

filling said depression with a second gate poly layer; and polishing said second poly gate layer using said isolation oxide as a polish stop, whereby said set of cells has a top surface at said isolation surface.

7. A method according to claim 6, further including the step of removing an upper portion of said conductive material within said strap aperture subset of said set of source-drain apertures to form a strap having a strap top surface below said isolation surface; and depositing an insulator above said strap and polishing said insulator to said isolation surface using said isolation oxide as a polish stop.

8. A method according to claim 7, further including the step of performing a field implant in said isolation areas and then growing a thin thermal oxide in said isolation areas before deposition of said isolation oxide.

* * * * *